United States Patent
Ratnam et al.

(10) Patent No.: US 9,298,545 B2
(45) Date of Patent: *Mar. 29, 2016

(54) DATA PROTECTION ACROSS MULTIPLE MEMORY BLOCKS

(71) Applicant: Micron Technology, Inc., Boise, ID (US)

(72) Inventors: Sampath K. Ratnam, Boise, ID (US); Troy D. Larsen, Meridian, ID (US); Doyle W. Rivers, Rancho Cordova, CA (US); Troy A. Manning, Meridian, ID (US); Martin L. Culley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/255,064

(22) Filed: Apr. 17, 2014

(65) Prior Publication Data

US 2014/0325316 A1 Oct. 30, 2014

Related U.S. Application Data

(63) Continuation of application No. 13/118,638, filed on May 31, 2011, now Pat. No. 8,732,557.

(51) Int. Cl.
*G11C 29/00* (2006.01)
*G06F 11/10* (2006.01)
*G11C 11/56* (2006.01)
*G11C 16/04* (2006.01)

(52) U.S. Cl.
CPC .......... *G06F 11/1068* (2013.01); *G06F 11/10* (2013.01); *G06F 11/108* (2013.01); *G11C 11/5628* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 5,859,858 A | 1/1999 | Leeman | |
| 6,683,817 B2 | 1/2004 | Wei et al. | |
| 7,203,874 B2 | 4/2007 | Roohparvar | |
| 7,548,459 B2 | 6/2009 | Han | |
| 7,877,665 B2 | 1/2011 | Mokhlesi | |
| 8,041,990 B2 | 10/2011 | O'Connor et al. | |
| 8,046,528 B2 | 10/2011 | Chu et al. | |
| 8,307,261 B2 | 11/2012 | Wu et al. | |
| 8,732,557 B2 * | 5/2014 | Ratnam et al. | 714/773 |
| 2007/0067705 A1 | 3/2007 | Kim | |
| 2008/0109704 A1 | 5/2008 | Christenson | |

(Continued)

FOREIGN PATENT DOCUMENTS

| TW | 200919171 | 5/2009 |
|---|---|---|
| TW | 201040977 | 11/2010 |

OTHER PUBLICATIONS

Office Action for related Taiwan Patent Application No. 101119402, dated Aug. 25, 2014, 20 pages.

(Continued)

*Primary Examiner* — Daniel McMahon
(74) *Attorney, Agent, or Firm* — Brooks, Cameron & Huebsch, PLLC

(57) ABSTRACT

Data protection across multiple memory blocks can include writing a first portion of a codeword in a first location of a first memory block and writing a second portion of the codeword in a second location of a second memory block. The second location of the second memory block can be different than the first location of the first memory block.

20 Claims, 4 Drawing Sheets

(56) References Cited

U.S. PATENT DOCUMENTS

| | | |
|---|---|---|
| 2008/0313493 A1 | 12/2008 | Roohparvar |
| 2009/0019321 A1 | 1/2009 | Radke |
| 2009/0019340 A1 | 1/2009 | Radke et al. |
| 2010/0122113 A1 | 5/2010 | Weingarten et al. |
| 2010/0262889 A1 | 10/2010 | Bains |
| 2010/0262890 A1 | 10/2010 | Radke |
| 2011/0093766 A1 | 4/2011 | Murray et al. |
| 2011/0119562 A1 | 5/2011 | Steiner et al. |
| 2011/0126080 A1 | 5/2011 | Wan et al. |
| 2011/0209028 A1 | 8/2011 | Post et al. |
| 2011/0222344 A1 | 9/2011 | Abraham |
| 2013/0080856 A1 | 3/2013 | Bueb |

OTHER PUBLICATIONS

International Search Report and Written Opinion for related PCT Application No. PCT/US2012/039846, mailed Dec. 20, 2012, (11 pgs.).

\* cited by examiner

DATA PROTECTION ACROSS MULTIPLE MEMORY BLOCKS

PRIORITY INFORMATION

This application is a continuation of U.S. application Ser. No. 13/118,638, filed May 31, 2011, which is incorporated by reference.

TECHNICAL FIELD

The present disclosure relates generally to semiconductor memory devices, methods, and systems, and more particularly, to data protection across multiple memory blocks.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips (as used herein, "a number of" something can refer to one or more of such things, e.g., a number of memory devices can refer to one or more memory devices). As one of ordinary skill in the art will appreciate, a memory chip can include a number of dies and/or logical units (LUNs). Each die can include a number of memory arrays and peripheral circuitry thereon. The memory arrays can include a number of memory cells organized into a number of physical pages, and the physical pages can be organized into a number of blocks. Information can be written to the pages as codewords, where a codeword includes write information and error information, e.g., error detection and/or correction information. In various instances, a number of codewords may be written to a single page.

DETAILED DESCRIPTION

Figure 1:
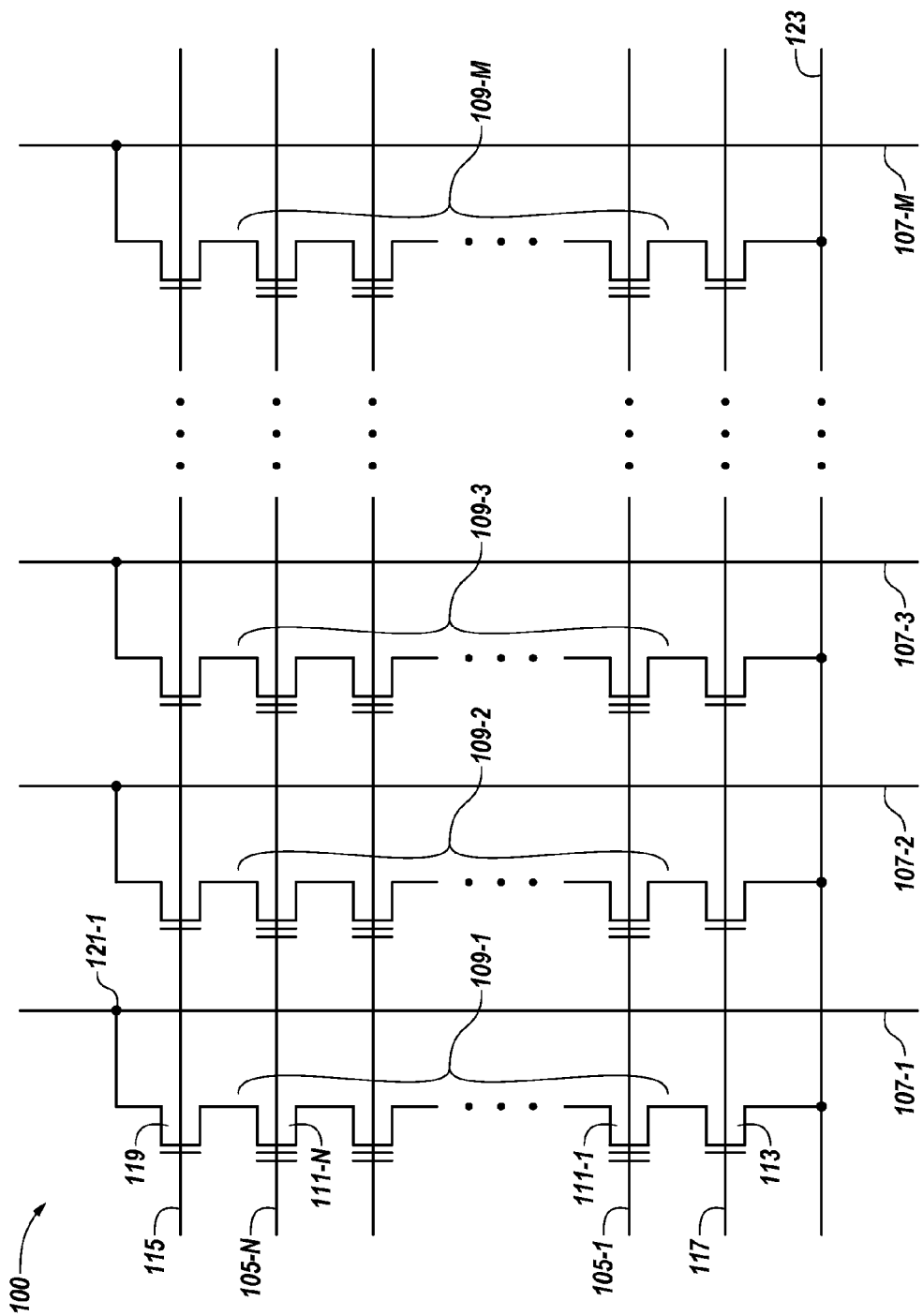
FIG. 1 illustrates a schematic diagram of a portion of a non-volatile memory array in accordance with a number of embodiments of the present disclosure.

The present disclosure includes methods, devices, and systems for data protection across multiple memory blocks. One method embodiment includes writing a first portion of a codeword in a first location of a first memory block and writing a second portion of the codeword in a second location of a second memory block. The second location can be different than the first location with respect to the second and the first memory blocks. Some previous approaches to writing codewords included writing an entire codeword, or more than one entire codeword per page, e.g., per page of memory cells in a single memory block.

The present disclosure can be used to help reduce errors having systematic dependencies by laying out codewords to mitigate and/or reduce peak error sources, e.g., problematic design, process, and/or other corners can be addressed. Considering various topologically dependent error rates, codewords can be laid out in a manner that results in lower peak error rates. Reducing peak error rates can have a direct impact on system design, for example, because systems may be designed in consideration of worst case corners.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B," "D," "N," "M," "R," and "S," particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 360-1 may reference element "60-1" in FIG. 3, and a similar element may be referenced as 460-1 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 illustrates a schematic diagram of a portion of a non-volatile memory array 100 in accordance with a number of embodiments of the present disclosure. The embodiment of FIG. 1 illustrates a NAND architecture non-volatile memory array. However, embodiments described herein are not limited to this example. As shown in FIG. 1, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . , 105-N and the number of local bit lines 107-1, 107-2, 107-3, . . . , 107-M can be some power of two, e.g., 256 word lines by 4,096 bit lines. However, embodiments are not limited to the number of word lines 105-1, . . . , 105-N and/or bit lines 107-1, 107-2, 107-3, . . . , 107-M being a power of two.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of the non-volatile memory cells 111-1, . . . , 111-N includes a source, a drain, a charge storage node such as a floating gate, and a control gate. The non-volatile memory cells 111-1, . . . , 111-N have their control gates coupled to a word line, 105-1, . . . , 105-N respectively. A "column" of the non-volatile memory cells, 111-1, . . . , 111-N, make up the NAND strings 109-1, 109-2, 109-3, . . . , 109-M, and are coupled to a given local bit line 107-1, 107-2, 107-3, . . . , 107-M, respectively. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

As one of ordinary skill in the art will appreciate, subsets of cells coupled to a selected word line, e.g., 105-1, . . . , 105-N, can be programmed and/or sensed, e.g., read, together as a group. A programming operation, e.g., a write operation, can include applying a number of program pulses, e.g., 16V-20V, to a selected word line in order to increase the threshold voltage (Vt) of selected cells coupled to that selected access line to a desired program voltage level corresponding to a target, e.g., desired, program state.

A sensing operation, such as a read or program verify operation, can include sensing a voltage and/or current change of a bit line coupled to a selected cell in order to determine the state of the selected cell. The sensing operation can involve providing a voltage to, e.g., biasing, a bit line, e.g., bit line 107-1, associated with a selected memory cell above a voltage, e.g., bias voltage, provided to a source line, e.g., source line 123, associated with the selected memory cell. A sensing operation could alternatively include pre-charging the bit line 107-1 followed with discharge when a selected cell begins to conduct, and sensing the discharge.

Sensing the state of a selected cell can include providing a number of sensing signals, e.g., read voltages, to a selected word line while providing a number of pass signals, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the state of the selected cell can be determined based on the current and/or voltage sensed on the bit line corresponding to the string. For instance, the state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string, the diffused regions between cell stacks, and the select transistors.

Figure 2:
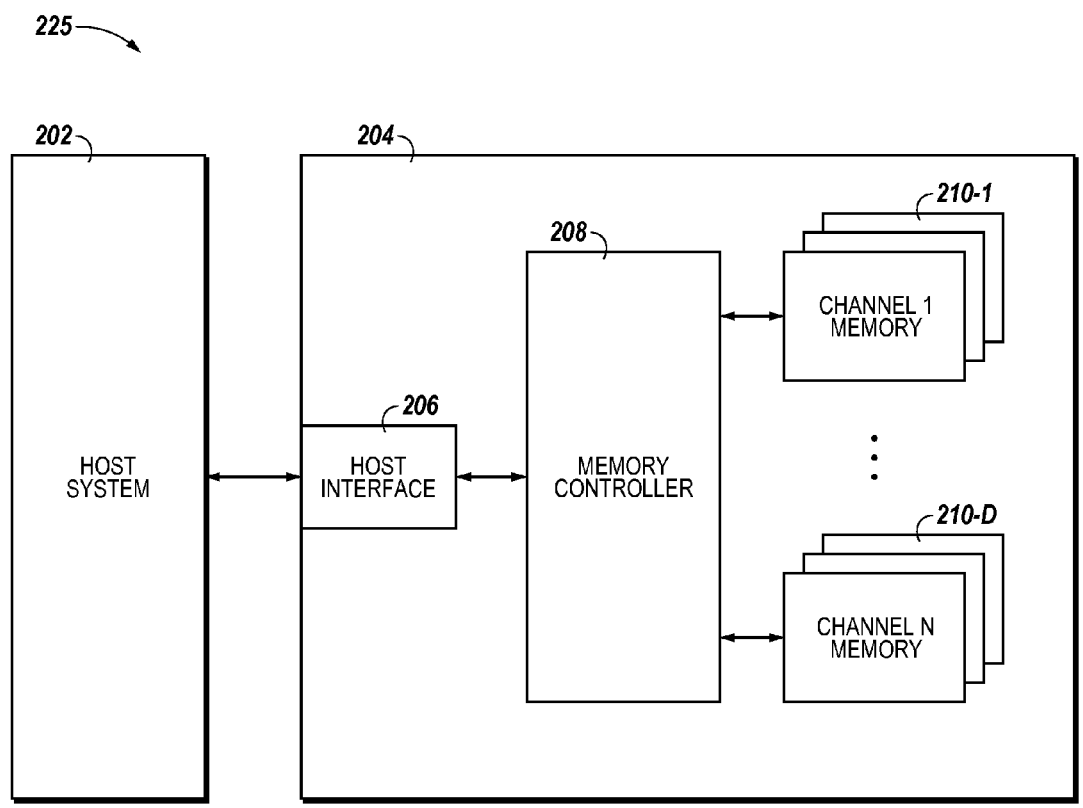
FIG. 2 illustrates a block diagram of a computing system including at least one memory system in accordance with a number of embodiments of the present disclosure.

FIG. 2 illustrates a block diagram of a computing system 225 including at least one memory system 204, in accordance with a number of embodiments of the present disclosure. In the embodiment illustrated in FIG. 2, the memory system 204, e.g., a solid state drive (SSD), can include a host interface 206, a memory controller 208, e.g., memory control circuitry and/or memory control firmware, and a number of memory devices 210-1, . . . , 210-D, e.g., solid state memory devices including non-volatile multilevel memory cells. The memory devices 210-1, . . . , 210-D can provide a storage volume for the memory system, e.g., with a file system formatted to the memory devices. In a number of embodiments, the memory controller 208 can be an application specific integrated circuit (ASIC) coupled to a printed circuit board including the physical host interface 206 and memory devices 210-1, . . . , 210-D.

As illustrated in FIG. 2, the memory controller 208 can be coupled to the host interface 206 and to the memory devices 210-1, . . . , 210-D by a plurality of channels. The memory controller 208 can be configured to perform the operations described herein, in addition to other memory operations as will be appreciated by those skilled in the art. The host interface 206 can be used to communicate information between the memory system 204 and another device such as a host 202. Host 202 can include a memory access device, e.g., a processor. One of ordinary skill in the art will appreciate that "a processor" can intend one or more processors, such as a parallel processing system, a number of coprocessors, etc. Example hosts include laptop computers, personal computers, digital cameras, digital recording and playback devices, mobile telephones, PDAs, memory card readers, interface hubs, and the like. For a number of embodiments, the host interface 206 can be in the form of a standardized interface. For example, when the memory system 204 is used for information storage in a computing system 225, the physical host interface 206 can be a serial advanced technology attachment (SATA), peripheral component interconnect express (PCIe), or a universal serial bus (USB), among other connectors and interfaces. In general, however, host interface 206 can provide an interface for passing control, address, information, and other signals between the memory system 204 and a host 202 having compatible receptors for the host interface 206.

The memory controller 208 can include host-memory translation circuitry configured to translate host addresses to memory addresses, e.g., addresses associated with a received command such as a read and/or write command. The host-memory translation circuitry might, for example, convert host sector read and write operations to commands directed to specific portions of the memory devices 210-1, . . . , 210-D. Each host operation can be translated into single or multi-sector memory device 210-1, . . . , 210-D operation. For example, host read and write commands can be translated into memory device 210-1, . . . , 210-D read and write commands. Although exclusively memory control circuitry could be used, a number of embodiments of the present disclosure can be implemented via memory control firmware. Therefore, as used herein, "memory controller" is defined to include memory control circuitry and/or memory control firmware. Memory control firmware can be stored in a tangible medium and executable by the memory controller 208 to cause the memory system 204 to perform various functions described herein, e.g., writing portions of a codeword in different locations of different memory blocks.

The host-memory translation circuitry can include first and/or second level error circuitry. Some examples of the error circuitry can perform error detection and/or error correction. First level error circuitry can be configured to detect errors and/or apply error correction such as BCH error correction, as will be understood by one of ordinary skill in the art, to detect and/or correct errors associated with information stored in the memory devices 210-1, . . . , 210-D. For example, the first level error circuitry can provide 29 bits of error correction over a 1080-bit codeword, however embodiments are not limited to a particular size of codeword or amount of error correction per codeword. In a number of embodiments, the number of bits of error correction can be optimized on a per-codeword basis to obtain better error characteristics. For example, more error correction can be provided for codewords associated with access lines that have a higher error rate, e.g., word lines near a drain select line. A codeword can include an amount of information less than, equal to, or greater than an amount of information in a page of data. A codeword can include, for example, write information, e.g., user information, flash translation layer (FTL) specific information, first level error information, e.g., CRC information, and/or second level error information, e.g., parity information.

The second level error circuitry can correct errors that are not correctable by the first level error circuitry, e.g., uncorrectable error correction code (UECC) errors, such as in response to the first-level error circuitry determining that there are more than a threshold amount of correctable errors. UECC errors can be corrected by recreating previously written write information using second level error information, e.g., parity information. Second level error circuitry can include exclusive or (XOR) circuitry, e.g., RAID XOR circuitry. The XOR circuitry can calculate parity information based on write information received from the host interface circuitry. For example, a parity bit can be calculated by RAID XOR circuitry and written to a particular one of the memory devices 210-1, . . . , 210-D for each bit of write information written to others of the number of the memory devices 210-1, . . . , 210-D. Embodiments are not limited to second level error circuitry comprising RAID XOR circuitry, nor are embodiments limited to second level error circuitry with the use of a RAID as second level error circuitry can be implemented without the use of a RAID.

ECC circuitry associated with the memory controller 208 in FIG. 2 can calculate first level error information for portions, e.g., fragments, of write information and/or second level detection, e.g., parity, information stored in the memory devices. Write information and error information can be written together. If an error is detected in information, whether write information or parity information, first level error information can be used in an attempt to correct the error before and/or without implementing a second level of error correction, e.g., the correction associated with parity information described above. A memory system may store sufficient first level error information to enable a threshold number of erroneous bits to be corrected. If an error is detected, e.g., a UECC error during a read operation, that includes more bit errors than are correctable with the first level error information, then the second level of error correction, e.g., using the parity information described above, may be implemented, e.g., the information associated with the error(s) may be recreated using parity information and a remainder of the write information.

According to a number of embodiments of the present disclosure, write information can be striped across a plurality of channels to a number of solid state memory devices in a RAID operation. As one of ordinary skill in the art will appreciate, striping includes dividing, e.g., splitting, information so that it is stored across a plurality of channels, for example on more than one device. The portions of the more than one device that store the divided information are collectively referred to as a stripe. In contrast, mirroring can include storing duplicate copies of information on more than one device.

A RAID structure can represent an implementation of a RAID storage scheme devised to divide and/or replicate information across multiple memory devices. For example, information can be striped and/or mirrored across two or more devices. Striping can include dividing write information into portions and storing at least one portion in each of a number of memory devices. Mirroring can include redundantly storing a copy of write information in at least two memory devices. Both striping and mirroring can include the use of error detection. Parity information can be stored in the same memory devices as write information and/or in a separate device from the devices storing write information. According to a number of embodiments of the present disclosure, the particular RAID structure to be implemented by a memory system can be a programmable option.

A memory channel, a memory device, a block of memory, a page of memory, or another portion of a memory device could experience an uncorrectable error or other error. Similar to the case of creating the parity information, the memory system, e.g., RAID XOR circuitry, can use parity information along with write information to calculate replacement information for information associated with a portion of the memory system that experiences an uncorrectable error or other error.

The memory controller 208 can maintain an LBA table and/or a block table. The LBA table can store the physical page address of pages in the number of memory devices 210-1, . . . , 210-D and include corresponding logical addresses. The LBA table can be indexed by the LBA that is contained in an associated command, e.g., an associated SATA command. The LBA table can be used to look-up physical page addresses that correspond to logical block addresses where corresponding information can be stored. The block table can store information for erasable blocks in the number of memory devices 210-1, . . . , 210-D. Information stored in the block table can include valid page information, erase count, and other status information. Information accessed from the block table can be indexed by physical block address.

The memory controller 208 can communicate with the memory devices 210-1, . . . , 210-D to read, write, and erase information, among other operations. Although the memory devices 210-1, . . . , 210-D are illustrated being coupled to a collective memory controller 208, a number of embodiments of the present disclosure can include a discrete non-volatile memory controller for each memory channel. A memory device 210-1, . . . , 210-D can include a number of arrays of memory cells, e.g., array 100 illustrated in FIG. 1.

The memory devices 210-1, . . . , 210-D can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 Gb memory device can include 4314 bytes of information per page, e.g., 4096 bytes of write information plus 218 bytes of overhead information, 128 pages per block, 2048 blocks per plane, and 16 planes per device.

The embodiment of FIG. 2 can include additional circuitry that is not illustrated so as not to obscure embodiments of the present disclosure. For example, the memory system 204 can include address circuitry to latch address signals provided over I/O connections through I/O circuitry. Address signals can be received and decoded by a row decoder and a column decoder to access the memory devices 210-1, . . . , 210-D. It will be appreciated by those skilled in the art that the number of address input connections can depend on the density and architecture of the memory devices 210-1, . . . , 210-D.

Figure 3:
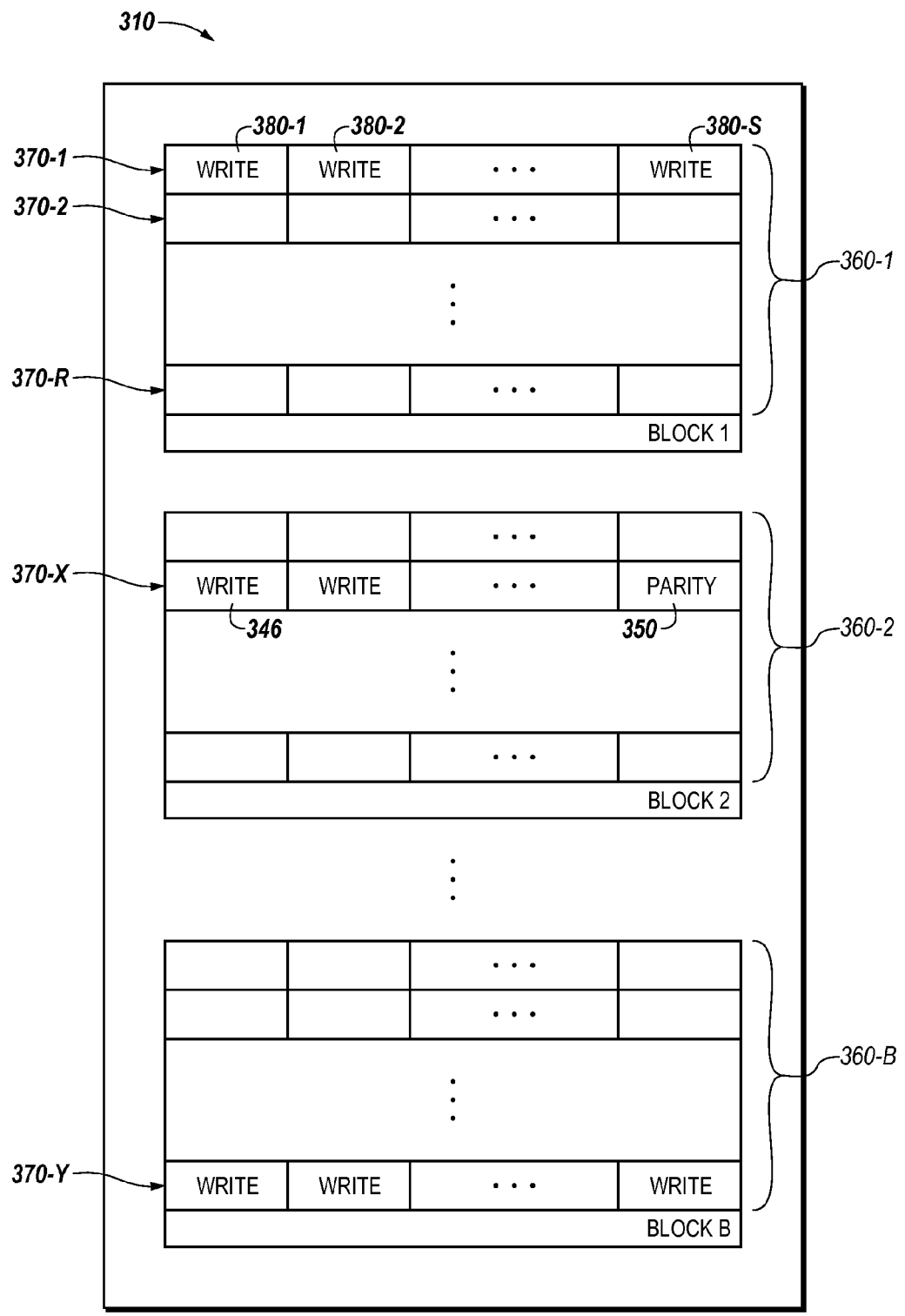
FIG. 3 illustrates a block diagram of a portion of a memory device in accordance with a number of embodiments of the present disclosure.

FIG. 3 illustrates a block diagram of a portion of a memory device 310, e.g., analogous to memory devices 210-1, . . . , 210-D illustrated in FIG. 2, in accordance with a number of embodiments of the present disclosure. Although not shown in FIG. 3, one of ordinary skill in the art will appreciate that the memory device 310 can be located on a semiconductor die along with various peripheral circuitry associated with the operation thereof. Memory device 310 can include a number of arrays of memory cells, e.g., analogous to array 100 illustrated in FIG. 1.

As shown in FIG. 3, memory device 310 can include a number of physical blocks 360-1 (BLOCK 1), 360-2 (BLOCK 2), . . . , 360-B (BLOCK B) of memory cells. As an example, the number of physical blocks in memory device 310 may be 128 blocks, 4,096 blocks, or 32,768 blocks; however, embodiments are not limited to a particular number or multiple of physical blocks in a memory device. In the embodiment illustrated in FIG. 3, the memory device 310 can be, for example, a NAND flash memory device such that, for example, the memory cells in each physical block 360-1, 360-2, . . . , 360-B can be erased together as a unit, e.g., the cells in each physical block can be erased in a substantially simultaneous manner.

The indicator "R" is used to indicate that a physical block, e.g., 360-1, 360-2, . . . , 360-B, can include a number of rows. In some embodiments, the number of rows, e.g., word lines, in each physical block can be 64, but embodiments are not limited to a particular number of rows 370-1, 370-2, . . . , 370-R per physical block. As one of ordinary skill in the art will appreciate, each row 370-1, 370-2, . . . , 370-R can include a number of physical pages, e.g., an even page and an odd page. A physical page refers to a unit of writing and/or reading, e.g., a number of cells that are written and/or read together or as a functional group of memory cells. Accordingly, an even page and an odd page can be written and/or read with separate writing and/or reading operations.

For embodiments including multilevel cells (MLC), a physical page can be logically divided into a lower page and an upper page, and, in some instances, a number of middle pages. For example, a memory cell storing two bits of information can contribute one bit to an upper page of information and one bit to a lower page of information. Thus a memory cell can be programmed to a data state of "01" where "0" corresponds to the lower page and "1" corresponds to the upper page. For example, a memory cell storing three bits of information can contribute one bit to an upper page of information, one bit to a middle page of information, and one bit to a lower page of information. Thus a memory cell can be programmed to a data state of "101" where "1" corresponds to the lower page, "0" corresponds to the middle page, and "1" corresponds to the upper page. Embodiments are not limited to these specific examples. Programming a memory cell can include a number of lower page programming, middle page programming, and upper page programming. Lower page programming and/or middle page programming can include programming the memory cell to an intermediate state and upper page programming can include programming the memory cell to a final state. The logical upper page, logical middle page, and/or logical lower page can be part of the same physical page.

In a number of embodiments of the present disclosure, and as shown in FIG. 3, a page can store information in a number of sectors 380-1, 380-2, . . . , 380-S. The indicator "S" is used to indicate that a page can include a number of sectors. Each sector 380-1, 380-2, . . . , 380-S can store write information and/or error information, such as error correction code (ECC) information, and/or other information such as logical block address (LBA) information. As one of ordinary skill in the art will appreciate, logical block addressing is a scheme that can be used by a host for identifying a sector of information, e.g., each sector can correspond to a unique LBA. In a number of embodiments, a sector is the smallest addressable portion of a storage volume. As an example, a sector of information can be a number of bytes of information, e.g., 256 bytes, 512 bytes, or 1,024 bytes. For example, an SSD can have 4, 8, or 16 sectors in a page, where a sector can be 512 bytes, and an SSD can have 128, 256, or 512 pages per physical block, therefore physical block sizes are 131072 bytes, 262144 bytes, and 524288 bytes. Embodiments are not limited to these examples.

It is noted that other configurations for the physical blocks 360-1, 360-2, . . . , 360-B, rows 370-1, 370-2, . . . , 370-R, sectors 380-1, 380-2, . . . , 380-S, and pages are possible. For example, the rows 370-1, 370-2, . . . , 370-R of the physical blocks 360-1, 360-2, . . . , 360-B can each store information corresponding to a single sector which can include, for example, more or less than 512 bytes of information.

Information including, for example, write information, e.g., user information, flash translation layer (FTL) specific information, first level error information, e.g., CRC information, and/or second level error information, e.g., parity information, can be written as a codeword. The codeword can include a number of portions of write information 346 and a number of portions of parity information 350. The codeword can be compiled from the write information and the parity information prior to writing the codeword. For example, parity information can be calculated for the write information and combined with the write information to create a codeword prior to writing the codeword. As described herein, the parity information can be generated, e.g., calculated, with a memory controller, e.g., control firmware and/or second level error circuitry. With respect to FIG. 3, the portions of write information 346 and the portions of parity information 350 are illustrated as sectors 380-1, 380-2, . . . , 380-S of information, however, embodiments are not so limited as portions of information can be divided into portions other than sectors 380-1, 380-2, . . . , 380-S.

According to a number of embodiments of the present disclosure, portions of a single codeword can be written in different blocks 360-1, 360-2, . . . , 360-B of a memory device 310. Portions of the single codeword can be written in different arrays of the memory device 310. Furthermore, different portions of the codeword can be written in different locations of the different blocks 360-1, 360-2, . . . , 360-B. For example, a single codeword including write information 346 and parity information 350 can be written as a first portion across row 370-1, e.g., a page and/or word line, of block 360-1 and as a second portion across row 370X, e.g., a page and/or word line, of block 360-2.

The first portion can be written in a first location, e.g., row 370-1, in the first block 360-1 and the second portion can be written in a second location, e.g., row 370X in the second block 360-2. The second location 370X is different than the first location 370-1 with respect to the second 360-2 and the first 360-1 memory blocks. For example, the first block 360-1 and the second block 360-2 can each include a number of word lines, e.g., 64 word lines. The first location can be a word line in a particular location of the first block 360-1, e.g., word line number 1 of the first block 360-1, and the second location can be a word line in a different location of the second block, e.g., word line number 2 of the second block 360-2. In some embodiments, two or more portions of a codeword can be written across two or more word lines in a first block 360-1 and at least one portion of the codeword can be written across at least one word line in a second block 360-2. One of the first and the second word lines can be nearer to a drain select line in the respective memory block than the other of the first and the second word lines. The first location can have a first error rate and the second location can have a second error rate that is different than the first error rate.

Writing the first portion can include programming a first page of memory cells. Writing the second portion can include programming a second page of memory cells. In some embodiments, programming the first page of memory cells can include programming a lower page of information in a first number of memory cells, and programming the second page of memory cells can include programming an upper page of information in a second number of memory cells, or vice versa. The codeword can include the lower page of information in the first number of memory cells and the upper page of information in the second number of memory cells. The second number of memory cells can be programmed with a lower page of information that is not included in the codeword, e.g., the lower page of information programmed in the second number of memory cells can be included in a different codeword. In a number of embodiments, writing the first portion can include programming a number of lower pages of information and writing the second portion can include programming a number of upper pages of information, or vice versa.

In a number of embodiments, both a lower page of information and an upper page of information programmed in a number of memory cells can be part of one codeword. A lower page of information and an upper page of information can be programmed to memory cells across row 370-1 in block 360-1 as a portion of a codeword, while another portion of the codeword can be written across row 370X in block 360-2.

Codewords can be written as more than two portions. For example, with respect to FIG. 3, the codeword can be written as a first portion in a first location, e.g. row 370-1, of a first block 360-1, a second portion in a second location, e.g., row 370X, of a second block 360-2, and a third portion in a third location, e.g., row 370Y, of a third block 360-B.

Different locations in a memory device 310 and/or a memory block 360-1, 360-2, . . . , 360-B can have different error rates associated therewith. For example, a first location in each memory block 360-1, 360-2, . . . , 360-B of a memory device 310 can have an error rate of 1×, a second location can have an error rate of 2×, a third location can have an error rate of 3×, and a fourth location can have an error rate of 4×. If a codeword were to be written across the fourth location of each of the four memory blocks, the combined error rate would be 16× (4×+4×+4×+4×). However, according to a number of embodiments of the present disclosure, the codeword can be written across different locations in different memory blocks 360-1, 360-2, . . . , 360-B. Thus, for example, the codeword can be written across the first location of the first block, the second location of the second block, the third location of the third block, and the fourth location of the fourth block for a combined error rate of 10× (1×+2×+3×+4×). Accordingly, a number of embodiments of the present disclosure can provide a reduced combined error rate. A memory controller can be configured to write portions of a codeword to various locations based on error rates of the respective locations. For example, the controller can write a first portion of the codeword to a first location having a first error rate and a second portion of the codeword to a second location having a second error rate that is different than the first error rate. Such embodiments can be beneficial for reducing a combined error rate by mitigating a higher error rate of a particular location with a lower error rate of another location.

In some instances, memory devices 310 may be provided with an amount of first level error circuitry and/or information, e.g., ECC, to correct for a "worst case" combined error rate, e.g., 16× in the example above. In some embodiments, first level error circuitry can be configured to provide first level error information on a per page basis. Some embodiments of the present disclosure can allow a memory device 310 to be provisioned with less first level error circuitry and/or information due to the reduced combined error rate, thus making the memory device 310 more cost effective. For example, some embodiments can provide a lower combined error rate on a per page basis, and therefore less error information can be generated on a per page basis, while still maintaining the integrity of the information stored in the memory device 310.

Error rates for different locations within a memory device 310 and/or memory block 360-1, 360-2, . . . , 360-B can be related to the technology and/or topology, e.g., physical organization, of the memory device 310 and/or memory block 360-1, 360-2, . . . , 360-B, e.g., SLC, MLC, number of word lines per block, location of the word lines with respect to other portions of a memory array, etc. For example with respect to technology of the memory device 310, MLC devices may have a higher error rate than SLC devices and the error rate can increase with an increased number of bits stored per memory cell. As another example with respect to the technology of the memory device 310, upper pages of information may have a higher error rate than lower pages of information.

The present disclosure can be used to help reduce errors having systematic dependencies by laying out codewords to mitigate and/or reduce peak error sources, e.g., problematic design, process, and/or other corners can be addressed. Considering various topologically dependent error rates, codewords can be laid out in a manner that results in lower peak error rates. Reducing peak error rates can have a direct impact on system design, for example, because systems may be designed in consideration of worst case corners.

For example, with respect to topology, edge word lines, e.g., word lines near or adjacent to source select lines such as source select line 117 illustrated in FIG. 1 and/or drain select lines such as drain select line 115 illustrated in FIG. 1, may be more likely to have higher error rates. Furthermore, word lines near or adjacent to a drain select line may have higher error rates than word lines farther away from the drain select line. As a more specific example, for a sample size of four memory blocks, each containing 64 word lines storing four pages of information per word line, testing has shown page errors of less than one page per word line for word lines numbered 1 through 55 (with numbering starting adjacent to the source select line) and errors between zero and six pages for word lines numbered 56-64, across the sample. Testing has also shown a nearly linear increase in the number of bit errors from word lines numbered 1-64. Furthermore, testing has shown that upper pages of information have proportionally higher bit error rates than lower pages of information. Embodiments are not limited to this specific example.

An average error rate can be determined for each location in a number of memory blocks 360-1, 360-2, . . . , 360-B collectively, for example, by testing locations in the memory blocks 360-1, 360-2, . . . , 360-B and calculating an average error rate for each location. The average error rate can be used in determining to which locations various portions of a codeword are to be written, e.g., to reduce a combined error rate for the codeword. An error rate for each location in the number of memory blocks 360-1, 360-2, . . . , 360-B can be determined individually, e.g., by testing specific locations in each memory block 360-1, 360-2, . . . , 360-B.

Figure 4:
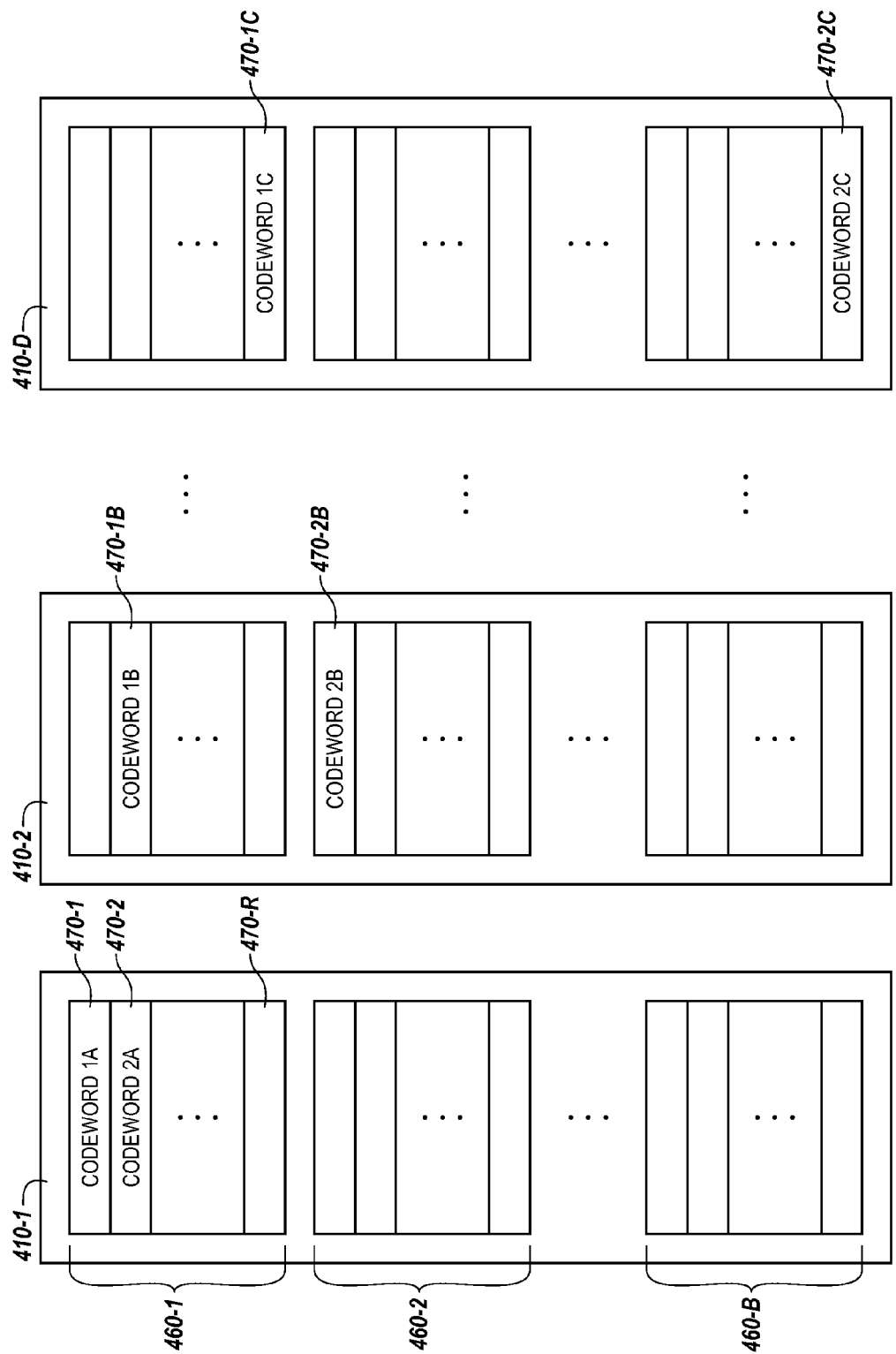
FIG. 4 illustrates a block diagram of portions of a number of memory devices in accordance with a number of embodiments of the present disclosure.

FIG. 4 illustrates a block diagram of portions of a number of memory devices 410-1, 410-2, . . . , 410-D in accordance with a number of embodiments of the present disclosure. The memory devices 410-1, 410-2, . . . , 410-D can be part of a memory system, e.g., memory system 204 illustrated in FIG. 2. The memory devices 410-1, 410-2, . . . , 410-D can be analogous the memory device 310 illustrated in FIG. 3. Each memory device 410-1, 410-2, . . . , 410-D can include a number of blocks of memory cells 460-1, 460-2, . . . , 460-B, and each block can include a number of rows 470-1, 470-2, . . . , 470-R.

A memory controller, e.g., memory controller 208 illustrated in FIG. 2, can be configured to write a first portion, e.g., "CODEWORD 1A," of a codeword in a first location, e.g., in row 470-1, in a first one 410-1 of the number of memory devices 410-1, 410-2, . . . , 410-D. The controller can be configured to write a second portion, e.g., "CODEWORD 1B," of the codeword in a second location, e.g., in row 470-1B, in a second one 410-2 of the number of memory devices 410-1, 410-2, . . . , 410-D. Additional portions of the codeword can be written to additional locations in the memory devices 410-1, 410-2, . . . , 410-D, e.g., "CODEWORD 1C," can be written in row 470-1C in device 410-D. As illustrated in FIG. 4, a codeword, e.g., including portions "CODEWORD 1A," "CODEWORD 1B," . . . , "CODEWORD 1C," can be written to different locations, e.g., rows 470-1, 470-1B, . . . , 470-1C, in blocks, e.g., blocks having the same physical location in each of the respective memory devices 410-1, 410-2, . . . , 410-D, of various memory devices 410-1, 410-2, . . . , 410-D. As is also illustrated in FIG. 4, a codeword, e.g., including portions "CODEWORD 2A," "CODEWORD 2B," . . . , "CODEWORD 2C," can be written to different locations, e.g., rows 470-2, 470-2B, . . . , 470-2C, in different blocks, e.g., blocks having different physical locations in each of the respective memory devices 410-1, 410-2, . . . , 410-D, of various memory devices 410-1, 410-2, . . . , 410-D.

As described herein, the first and second locations can have different error rates associated therewith. Writing the various portions can include programming a number of lower pages of information and/or programming a number of upper pages of information.

CONCLUSION

The present disclosure includes methods, devices, and systems for data protection across multiple memory blocks. One method embodiment includes writing a first portion of a codeword in a first location of a first memory block and writing a second portion of the codeword in a second location of a second memory block. The second location can be different than the first location with respect to the second and the first memory blocks.

The present disclosure can be used to help reduce errors having systematic dependencies by laying out codewords to mitigate and/or reduce peak error sources, e.g., problematic design, process, and/or other corners can be addressed. Considering various topologically dependent error rates, codewords can be laid out in a manner that results in lower peak error rates. Reducing peak error rates can have a direct impact on system design, for example, because systems may be designed in consideration of worst case corners.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure. Furthermore, the use of a "first portion" and a "second portion" does not exclude the possibility of additional portions unless specifically stated.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for data protection across multiple memory blocks, comprising:
    programming a lower page of information, comprising a first portion of a codeword, in a first location of a first memory block;
    programming a middle page of information, comprising a second portion of the codeword, in a second location of a second memory block; and
    programming an upper page of information, comprising a third portion of the codeword, in a third location of a third memory block;
    wherein the first memory block, the second memory block, and the third memory block are different memory blocks;
    wherein the first location is in a different location in the first memory block than the second location is in the second memory block; and
    wherein the first location is in a different location in the first memory block than the third location is in the third memory block.

2. The method of claim 1, wherein the method includes compiling the codeword from write information and second level error information prior to programming the lower page of information.

3. The method of claim 2, wherein the method includes generating the second level error information with control firmware.

4. The method of claim 2, wherein the method includes generating the second level error information with second level error circuitry.

5. The method of claim 2, wherein the second level error information comprises parity information.

6. The method of claim 1, wherein the method includes programming the lower page of information in the first location, the middle page of information in the second location, and the upper page of information in the third location based on error rates of the first location, the second location, and the third location.

7. A method for data protection across multiple memory blocks, comprising:
    programming an upper page of information, comprising a first portion of a codeword, in a first location of a first memory block that has a first error rate;
    programming a middle page of information, comprising a second portion of the codeword, in a second location of a second memory block that has a second error rate; and
    programming a lower page of information, comprising a third portion of the codeword, in a third location of a third memory block that has a third error rate, wherein the first error rate, second error rate, and third error rate are different error rates, and wherein the first memory block, second memory block, and third memory block are different memory blocks.

8. The method of claim 7, wherein the method includes programming the upper page of information, the middle page of information, and the lower page of information according to a previously determined average error rate for each of a number of locations in the first memory block, the second memory block, and the third memory block collectively.

9. The method of claim 7, wherein the method includes programming the upper page of information, the middle page of information, and the lower page of information according to a previously determined average error rate for each of a number of locations in the first memory block, the second memory block, and the third memory block individually.

10. The method of claim 7, wherein:
    programming the upper page of information comprises programming a page of memory cells coupled to a first access line; and
    programming the middle page of information comprises programming a page of memory cells coupled to a second access line, wherein the second access line is nearer to a second drain select line in the second memory block than the first access line is to a first drain select line in the first memory block.

11. A memory device, comprising:
    an array of memory cells; and
    control circuitry coupled to the array of memory cells and configured to:
        program a lower page of information, comprising a first portion of a codeword, in a number of memory cells coupled to a first access line in a first memory block;
        program a middle page of information, comprising a second portion of the codeword, in a number of memory cells coupled to a second access line in a second memory block; and
        program an upper page of information, comprising a third portion of the codeword, in a number of memory cells coupled to a third access line in a third memory block.

12. The memory device of claim 11, wherein the control circuitry includes second level error circuitry configured to calculate second level error information, and wherein the codeword includes write information and the second level error information.

13. The memory device of claim 11, wherein the control circuitry is configured to program a particular page of information, comprising a particular portion of a different codeword, in a number of memory cells coupled to a second access line of the first memory block.

14. The memory device of claim 11, wherein the first access line is adjacent to a drain select line of the first memory block.

15. The memory device of claim 14, wherein the second access line is not adjacent to a drain select line of the second memory block.

16. The memory device of claim 11, wherein the memory device includes a number of arrays of memory cells coupled to the control circuitry;
  wherein the first memory block is in a first one of the number of arrays;
  wherein the second memory block is in a second one of the number of arrays; and
  wherein the third memory block is in a third one of the number of arrays.

17. A memory system, comprising:
  a number of memory devices each including a number of arrays of memory cells; and
  a memory controller coupled to the number of memory devices, wherein the memory controller is configured to:
    program an upper page of information, comprising a first portion of a codeword, in a first location of a first one of the number of memory devices, wherein the first location has a first error rate; and
    program a middle page of information, comprising a second portion of the codeword, in a second location of a second one of the number of memory devices, wherein the second location has a second error rate; and
    program a lower page of information, comprising a third portion of the codeword, in a third location of a third one of the number of memory devices, wherein the third location has a third error rate;
    wherein the first error rate, second error rate, and third error rate are different error rates; and
    wherein the first memory block, second memory block, and third memory block are different memory blocks.

18. The memory system of claim 17, wherein the memory controller includes first level error circuitry configured to provide first level error information on a per codeword basis.

19. The memory system of claim 17, wherein the memory controller includes control firmware instructions stored in a tangible medium executable to cause the memory system to program the upper page of information, the middle page of information, and the lower page of information.

20. The memory system of claim 17, wherein the memory controller includes control circuitry configured to cause the memory system to program the upper page of information, the middle page of information, and the lower page of information.

* * * * *